US005602783A

United States Patent [19]
Ong

[11] Patent Number: 5,602,783
[45] Date of Patent: Feb. 11, 1997

[54] MEMORY DEVICE OUTPUT BUFFER

[75] Inventor: Adrian E. Ong, San Jose, Calif.

[73] Assignee: Micron Technology, Inc., Boise, Id.

[21] Appl. No.: 595,370

[22] Filed: Feb. 1, 1996

[51] Int. Cl.$^6$ .................................................. G11C 11/40
[52] U.S. Cl. ............... 365/189.05; 365/149; 365/189.11; 326/57
[58] Field of Search ........................ 365/189.05, 189.11, 365/230.08, 149; 326/57, 56, 58

[56] References Cited

U.S. PATENT DOCUMENTS

| | | | |
|---|---|---|---|
| 5,502,671 | 3/1996 | Koelling et al. | 365/189.05 |
| 5,513,140 | 4/1996 | Merritt | 365/189.05 |

*Primary Examiner*—David C. Nelms
*Assistant Examiner*—Vu A. Le
*Attorney, Agent, or Firm*—Seed and Berry LLP

[57] ABSTRACT

An output buffer stores a supply voltage on a capacitor when an input is a logic "0", and boosts a boot voltage at the capacitor's first terminal above the supply voltage by an NMOS threshold voltage when the input is a logic "1". A PMOS transistor receives the boot voltage at its source and outputs the boot voltage at its drain when the boot voltage exceeds its gate voltage by a PMOS threshold voltage. A first NMOS transistor couples its drain to ground when its gate voltage exceeds the NMOS threshold voltage. A second NMOS transistor's gate is coupled to the PMOS and first NMOS transistors' drains, and the second NMOS transistor outputs the supply voltage at its source when its gate voltage exceeds the supply voltage by the NMOS threshold voltage. When the input is a logic "1", a control circuit drops the PMOS and first NMOS transistor's gate voltages to ground, thereby applying the boot voltage at the second NMOS transistor's gate and causing the second NMOS transistor to output the supply voltage. When the input is a logic "0", the control circuit raises the PMOS transistor's gate voltage to the supply voltage. The control circuit also raises the first NMOS transistor's gate voltage above the NMOS threshold voltage, but does so only after the boot voltage exceeds the PMOS transistor's gate voltage by less than the PMOS threshold voltage. Thus, the capacitor cannot discharge to ground because the PMOS and first NMOS transistors are never on simultaneously.

18 Claims, 2 Drawing Sheets

MEMORY DEVICE OUTPUT BUFFER

FIELD OF THE INVENTION

This invention relates in general to memory devices, and in particular to output buffers for memory devices.

BACKGROUND OF THE INVENTION

Dynamic random access memories (DRAM's) output data bits stored in their arrays through output buffers. Typically, an output buffer receives a data bit from a DRAM's array on the DRAM's internal input/output (I/O) bus. The output buffer then outputs the data bit by driving an external data bus. If the data bit is a logic "1" bit, it is desirable for the output buffer to drive the external data bus to a voltage at or near the supply voltage so the data bit will properly read as a logic "1" bit. A typical supply voltage is 3.3 volts.

A conventional output buffer 10 capable of driving an external data bus (not shown) to the supply voltage is shown in FIG. 1. Although the output buffer 10 shown in FIG. 1 is only capable of a high impedance state and a logic "1" state as described below, it will be understood that other well-known circuitry (not shown) is typically included in the output buffer 10 to make it capable of a logic "0" state as well.

During a DRAM's column address strobe precharge time $t_{CP}$, the output buffer 10 is in a high impedance state. In this state, a low control signal QED* drives the output of an inverter 12 high, causing a NOR gate 14 to output a low. The low output of the NOR gate 14 drives the output of an inverter 16 high. The high output of the inverter 16 applied at the gate of an NMOS transistor 18 turns the NMOS transistor 18 on. The NMOS transistor 18 then couples the gate of an NMOS transistor 20 to ground, thereby turning off the NMOS transistor 20. As a result, a buffered data output DQ floats.

At the same time, the low output of the NOR gate 14 drives the output of an inverter 22 high. The high output of the inverter 22 applied at the gate of a PMOS transistor 24 turns the PMOS transistor 24 off, thereby isolating the NMOS transistors 18 and 20 from a first terminal 26 of a boot capacitor 28. The high output of the inverter 22 also causes an inverter 30 to output a low, thus grounding a second terminal 32 of the boot capacitor 28.

The low output of the NOR gate 14 during the high impedance state also drives the output of an inverter 34 high to a word-line voltage $V_{WL}$ such as 5.0 volts. Because the word-line voltage $V_{WL}$ is significantly greater than the supply voltage $V_{CC}$, the high output of the inverter 34 applied at the gate of an NMOS transistor 36 turns on the NMOS transistor 36 and causes it to apply the full supply voltage $V_{CC}$ to the first terminal 26 of the boot capacitor 28. This in turn causes the boot capacitor 28 to store the supply voltage $V_{CC}$ during the DRAM's column address strobe precharge time $t_{CP}$.

At a later time, the output buffer 10 may switch to a state in which it outputs a logic "0" bit, although a "pull down" circuit which typically drives the output of the buffer 10 to a logic "0" level is not shown in FIG. 1. In this logic "0" state, a high input signal LDQ* representing the logic "0" bit from the DRAM's array (not shown) causes the boot capacitor 28 to store the supply voltage $V_{CC}$ in the same way that the low control signal QED* does during the high impedance state described above.

The output buffer 10 may also switch at a later time to a state in which it outputs a logic "1" bit. In this logic "1" state, a high control signal QED* causes the inverter 12 to output a low. At the same time, a low input signal LDQ* representing the logic "1" bit from the DRAM's array (not shown) together with the low output from the inverter 12 drives the output of the NOR gate 14 high.

The high output of the NOR gate 14 causes the inverter 16 to output a low, and this low output applied at the gate of the NMOS transistor 18 turns off the NMOS transistor 18, thereby isolating the gate of the NMOS transistor 20 from ground. The high output of the NOR gate 14 also causes the inverter 34 to output a low, and this low output applied at the gate of the NMOS transistor 36 turns off the NMOS transistor 36, thereby isolating the first terminal 26 of the boot capacitor 28 from the supply voltage $V_{CC}$.

At the same time, the high output of the NOR gate 14 during the logic "1" state causes the inverter 22 to output a low, thereby driving the output of the inverter 30 high. The high output of the inverter 30 drives the second terminal 32 of the boot capacitor 28 to the supply voltage $V_{CC}$. Because the boot capacitor 28 stored the supply voltage $V_{CC}$ during the DRAM's column address strobe precharge time $t_{CP}$ as described above, the supply voltage $V_{CC}$ at the boot capacitor's second terminal 32 "boots" a boot voltage $V_{BOOT}$ at the boot capacitor's first terminal 26 well above the supply voltage $V_{CC}$.

The low output of the inverter 22 applied at the gate of the PMOS transistor 24 turns the PMOS transistor 24 on, thereby causing it to apply the boot voltage $V_{BOOT}$ at the gate of the NMOS transistor 20. Because the boot voltage $V_{BOOT}$ is well above the supply voltage $V_{CC}$, it turns the NMOS transistor 20 on and causes the NMOS transistor 20 to output a buffered signal at the DQ output at the full supply voltage $V_{CC}$. The output buffer 10 then drives an external data bus (not shown) to the supply voltage $V_{CC}$ with the buffered signal at the DQ output. Thus, in its logic "1" state the output buffer 10 is able to drive the external data bus (not shown) to the supply voltage $V_{CC}$ as a result of the boot capacitor 28 storing the full supply voltage $V_{CC}$ previous to the logic "1" state and then generating the high boot voltage $V_{BOOT}$ during the logic "1" state.

Although the prior art circuit shown in FIG. 1 generally is considered satisfactory, it has been discovered that the boot capacitor 28 tends to discharge its stored voltage during operation of the output buffer 10. Generally, this has not been a problem when the output buffer 10 outputs a variety of logic "1" and "0" bits because the output buffer 10 recharges the boot capacitor 28 in its logic "0" state as described above.

This also generally has not been a problem when the output buffer 10 outputs a series of logic "1" bits, because the output buffer 10 recharges the boot capacitor 28 between the logic "1" bits during the column address strobe precharge time $t_{CP}$ as described above. However, current DRAM column address strobe precharge times $t_{CP}$ which approach 10 nS do not give the typical output buffer 10 enough time to fully recharge the boot capacitor 28 between the logic "1" bits. As a result, the boot capacitor 28 partially discharges when the output buffer 10 outputs each logic "1" bit, causing the boot voltage $V_{BOOT}$ to increasingly "droop" for each successive logic "1" bit. In turn, the drooping boot voltage $V_{BOOT}$ eventually causes the NMOS transistor 20 to output the buffered signal DQ at less than the full supply voltage $V_{CC}$. Unfortunately, this may cause some of the logic "1" bits to be misread as logic "0" bits.

Therefore, there is a need in the art for an output buffer which can consistently output a series of logic "1" bits at a voltage near the supply voltage.

SUMMARY OF THE INVENTION

An inventive output buffer includes a charging circuit coupling a boot capacitor's first terminal to a supply voltage when an input signal is inactive and isolating the first terminal from the supply voltage when the input signal is active. A boot circuit couples the boot capacitor's second terminal to a reference potential when the input signal is inactive and to a bias voltage greater than the reference potential by at least a pull-up transistor's threshold voltage when the input signal is active. As a result, the boot and charging circuits store the supply voltage less the reference potential on the boot capacitor when the input signal is inactive and boost a boot voltage at the boot capacitor's first terminal greater than the supply voltage by at least the pull-up transistor's threshold voltage when the input signal is active.

A pass transistor receives the boosted boot voltage at its input terminal and outputs the boosted boot voltage at its output terminal when the boosted boot voltage is greater than a pass control voltage at its control terminal by at least the pass transistor's threshold voltage. Otherwise, the pass transistor isolates its output terminal from the boot voltage. A pull-down transistor couples its output terminal to the reference potential when a pull-down control voltage at its control terminal is greater than the reference potential by at least the pull-down transistor's threshold voltage. Otherwise, the pull-down transistor isolates its output terminal from the reference potential. The pull-up transistor has a control terminal coupled to the pass and pull-down transistors' output terminals, and it receives the supply voltage at its supply terminal and outputs a buffered signal at its output terminal at the supply voltage when a voltage (such as the boosted boot voltage) at its control terminal is greater than the supply voltage by at least the pull-up transistor's threshold voltage.

When the input signal is active, a control circuit provides the pass control voltage to the pass transistor at less than the boot voltage by at least the pass transistor's threshold voltage. At the same time, the control circuit provides the pull-down control voltage to the pull-down transistor at greater than the reference potential by less than the pull-down transistor's threshold voltage. As a result, the pull-down transistor isolates the pull-up transistor's control terminal from the reference potential, and the pass transistor supplies the boosted boot voltage to the pull-up transistor's control terminal so the pull-up transistor outputs the buffered signal at the supply voltage.

When the input signal is inactive, the control circuit provides the pass control voltage to the pass transistor at greater than the reference potential by the supply voltage. The control circuit also provides the pull-down control voltage to the pull-down transistor at greater than the reference potential by at least the pull-down transistor's threshold voltage, but does so only when a feedback voltage received from one of the boot capacitor's terminals corresponds to the boot voltage being greater than the pass control voltage by less than the pass transistor's threshold voltage. As a result, the pass and pull-down transistors are never on at the same time, thereby preventing the boot capacitor from discharging through the pass and pull-down transistors to the reference potential.

DETAILED DESCRIPTION OF THE INVENTION

Figure 1:
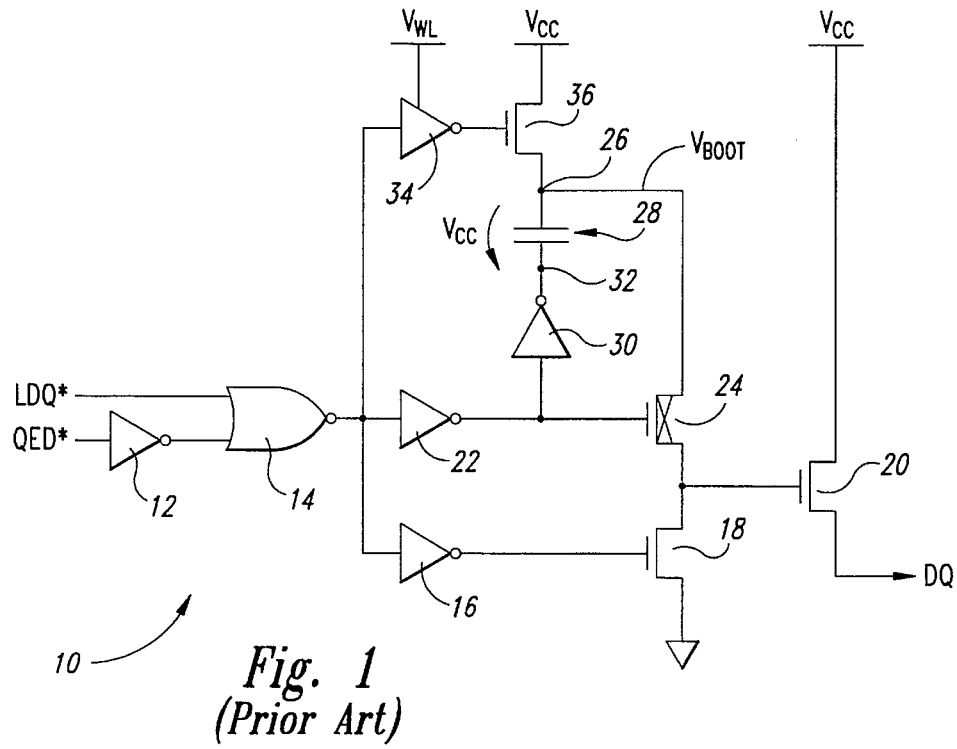
FIG. 1 is a schematic of a prior art output buffer.

The inventor has discovered that, under some conditions, the boot capacitor 28 shown in FIG. 1 partially discharges when the output buffer 10 switches from the logic "1" state (in which the input signal LDQ* is low) to the high impedance state (in which the input signal LDQ* is high). This discharge occurs as follows.

As described above, in the logic "1" state the low input signal LDQ* and the high control signal QED* drive the output of the NOR gate 14 high, causing the inverter 22 to output a low. The low output of the inverter 22 applied at the gate of the PMOS transistor 24 turns the PMOS transistor 24 on.

When the input signal LDQ* changes to high, the output buffer 10 begins to change to the high impedance state. The high input signal LDQ* causes the NOR gate 14 to output a low, thereby driving the outputs of the inverters 16 and 22 toward the supply voltage $V_{CC}$. The rising output of the inverter 22 drives the output of the inverter 30 and the second terminal 32 of the boot capacitor 28 toward ground, thereby causing the boot voltage $V_{BOOT}$ at the boot capacitor's first terminal 26 to fall toward the supply voltage $V_{CC}$ previously stored on the boot capacitor 28. At the same time, the high output of the inverter 16 starts turning on the NMOS transistor 18, and the high output of the inverter 22 attempts to turn off the PMOS transistor 24. However, the high ($V_{CC}$ voltage) applied to the gate of the PMOS transistor 24 cannot turn off the transistor 24 until the boot voltage $V_{BOOT}$ falls substantially to $V_{CC}$. There is often a delay in driving the voltage at the second terminal 32 of the boot capacitor 28 to ground so that the boot voltage $V_{BOOT}$ remains sufficiently above $V_{CC}$ to maintain the PMOS transistor 24 on after the NMOS transistor 18 is turned on. Under these circumstances, the boot capacitor 28 partially discharges to ground through the PMOS transistor 24 and the NMOS transistor 18. Shortly thereafter, when the difference between the falling boot voltage $V_{BOOT}$ and the rising output of the inverter 22 is less than the magnitude of the threshold voltage of the PMOS transistor 24, the PMOS transistor 24 turns off and the boot capacitor 28 stops discharging to ground.

Figure 2:
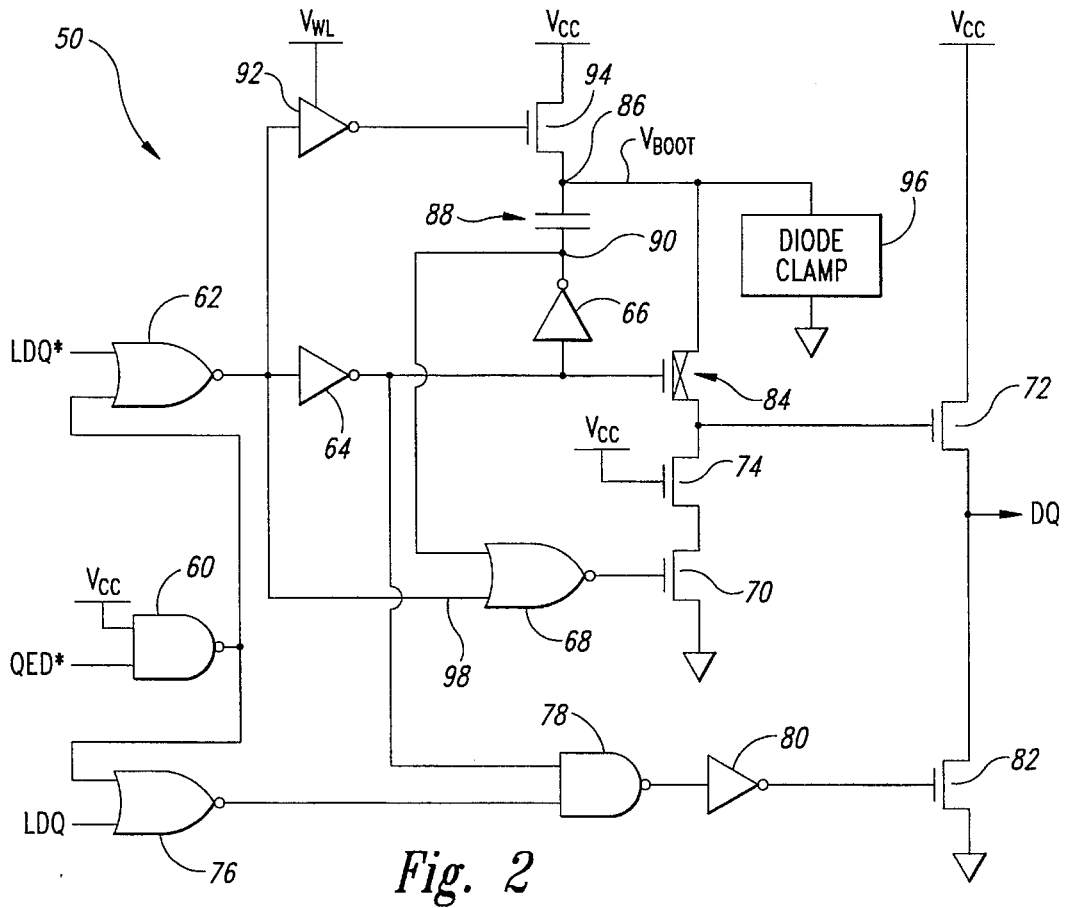
FIG. 2 is a schematic of a preferred output buffer according to the present invention.

The present invention solves this problem. In general, a preferred output buffer 50 shown in FIG. 2 stores a supply voltage $V_{CC}$ in a high impedance state during the column address strobe precharge time $t_{CP}$ of a memory device (shown in FIG. 3), outputs a logic "1" bit in a logic "1" state, and then prevents the stored supply voltage $V_{CC}$ from discharging when switching from the logic "1" state back to the high impedance state.

In the high impedance state of the output buffer 50, the supply voltage $V_{CC}$ is stored as follows. A low control signal QED* drives the output of a NAND gate 60 high, causing a NOR gate 62 to output a low. The low output of the NOR gate 62 drives the output of an inverter 64 high, causing an inverter 66 to output a low. The low output of the inverter 66 together with the low output of the NOR gate 62 drives the output of a NOR gate 68 high, causing a pull-down NMOS transistor 70 to turn on. When on, the pull-down NMOS transistor 70 couples the gate of a pull-up NMOS transistor 72 to ground through a resistance-connected NMOS transistor 74, thereby turning off the pull-up NMOS transistor 72.

At the same time, the high output of the NAND gate 60 causes a NOR gate 76 to output a low. The low output of the NOR gate 76 drives the output of a NAND gate 78 high, causing an inverter 80 to output a low. The low output of the inverter 80 applied at the gate of an NMOS transistor 82 turns off the NMOS transistor 82. As a result of the NMOS transistors 72 and 82 being off, a buffered data output DQ floats.

While the output buffer 50 is in the high impedance state, the high output of the inverter 64 applied at the gate of a pass PMOS transistor 84 turns off the pass PMOS transistor 84, thereby isolating the NMOS transistors 70, 72 and 74 from a first terminal 86 of a boot capacitor 88. Also, the low output of the inverter 66 grounds a second terminal 90 of the boot capacitor 88. At the same time, the low output of the NOR gate 62 drives the output of an inverter 92 high to a word-line voltage $V_{WL}$ such as 5.0 volts. Because the word-line voltage $V_{WL}$ is significantly greater than the supply voltage $V_{CC}$, the high output of the inverter 92 applied at the gate of a charging NMOS transistor 94 turns on the charging NMOS transistor 94 and causes it to apply the full supply voltage $V_{CC}$ to the first terminal 86 of the boot capacitor 88. As a result, the boot capacitor 88 stores the supply voltage $V_{CC}$.

At a later time, the output buffer 50 may switch to its logic "1" state and output a logic "1" bit as follows. A high input signal LDQ representing the logic "1" bit from a memory array (FIG. 3) causes the NOR gate 76 to output a low, thereby driving the output of the NAND gate 78 high and the output of the inverter 80 low. The low output of the inverter 80 applied at the gate of the NMOS transistor 82 turns off the NMOS transistor 82, thereby isolating the buffered data output DQ from ground.

Also, a high control signal QED* from a control bus (FIG. 3) causes the NAND gate 60 to output a low. The low output of the NAND gate 60 together with a low input signal LDQ* also representing the logic "1" bit from the memory array (FIG. 3) drives the output of the NOR gate 62 high.

The high output of the NOR gate 62 causes the NOR gate 68 to output a low, and this low output applied at the gate of the pull-down NMOS transistor 70 turns off the pull-down NMOS transistor 70, thereby isolating the gate of the pull-up NMOS transistor 72 from ground. The high output of the NOR gate 62 also causes the inverter 92 to output a low, and this low output applied at the gate of the charging NMOS transistor 94 turns off the charging NMOS transistor 94, thereby isolating the first terminal 86 of the boot capacitor 88 from the supply voltage $V_{CC}$.

At the same time, the high output of the NOR gate 62 during the logic "1" state causes the inverter 64 to output a low, thereby driving the output of the inverter 66 high. The high output of the inverter 66 drives the second terminal 90 of the boot capacitor 88 to the supply voltage $V_{CC}$. Because the boot capacitor 88 stored the supply voltage $V_{CC}$ during the high impedance state as described above, the supply voltage $V_{CC}$ at the boot capacitor's second terminal 90 "boots" a boot voltage $V_{BOOT}$ at the boot capacitor's first terminal 86 well above the supply voltage $V_{CC}$. A diode clamp 96 typically limits the booted boot voltage $V_{BOOT}$ to about four NMOS threshold voltages above the supply voltage $V_{CC}$ ($V_{BOOT} \leq V_{CC} + 4V_T$). The supply voltage $V_{CC}$ at the boot capacitor's second terminal 90 also assists the high output of the NOR gate 62 in driving the output of the NOR gate 68 low, and thereby assists in turning the pull-down NMOS transistor 70 off.

The low output of the inverter 64 applied at the gate of the pass PMOS transistor 84 turns on the pass PMOS transistor 84, thereby causing it to apply the boot voltage $V_{BOOT}$ at the gate of the pull-up NMOS transistor 72. Because the boot voltage $V_{BOOT}$ is well above the supply voltage $V_{CC}$, it turns on the pull-up NMOS transistor 72 and causes the pull-up NMOS transistor 72 to output the buffered data output DQ at the full supply voltage $V_{CC}$. The output buffer 50 then drives an external data bus (FIG. 3) to the supply voltage $V_{CC}$ with the buffered data output DQ. As a result, the buffered data output DQ outputs the logic "1" bit.

When the logic "1" state is finished, the control signal QED* changes to low and causes the output buffer 50 to begin to switch back to the high impedance state. As described below, while the output buffer 50 switches, the boot capacitor 88 does not discharge because the output buffer 50 prevents the transistor 70 from turning on until the transistor 84 turns off.

The low control signal QED* drives the output of the NAND gate 60 high, causing the NOR gate 62 to output a low. The low output of the NOR gate 62 causes an input 98 of the NOR gate 68 to go low and drives the output of the inverter 64 high. The low input 98 then enables the NOR gate 68 so that its output may subsequently go high to turn on the pull-down NMOS transistor 70. The high output of the inverter 64 also simultaneously attempts to turn off the PMOS transistor 84, and it starts to drive the output of the inverter 66 low, thereby driving the second terminal 90 toward $V_{CC}$. However, even though the output of the inverter 64 is high at $V_{CC}$, the PMOS transistor 84 does not immediately turn off because the voltage at the first terminal 86 is above $V_{CC}$. The PMOS transistor 84 does not turn off until the voltage at the first terminal 86 falls to substantially $V_{CC}$. The voltage on the terminal 86 does not reach $V_{CC}$ until the inverter 66 pulls the voltage on the second terminal 90 low to about zero volts.

However, because the NOR gate 68 is coupled to the boot capacitor's second terminal 90, the output of the NOR gate 68 cannot go high and thereby turn on the pull-down NMOS transistor 70 until the voltage at the second terminal 90 falls substantially to ground. Before the voltage at the second terminal 90 can fall substantially to ground as a result of the high output of the inverter 64 driving the output of the inverter 66 low, the voltage at the second terminal 90 falls enough to cause the boot voltage $V_{BOOT}$ at the first terminal 86 to fall sufficiently to turn off the pass PMOS transistor 84. Shortly thereafter, the voltage at the second terminal 90 falls substantially to ground, thereby driving the output of the NOR gate 68 high and turning on the pull-down NMOS transistor 70.

Thus, the boot capacitor 88 never has the opportunity to discharge to ground when the output buffer 50 switches from its logic "1" state to its high impedance state, because feedback from the second terminal 90 of the boot capacitor 88 doesn't allow the pull-down NMOS transistor 70 to turn on until the pass PMOS transistor 84 turns off. Therefore, the inventive output buffer 50 can consistently output logic "1" bits at a voltage near the supply voltage.

Figure 3:
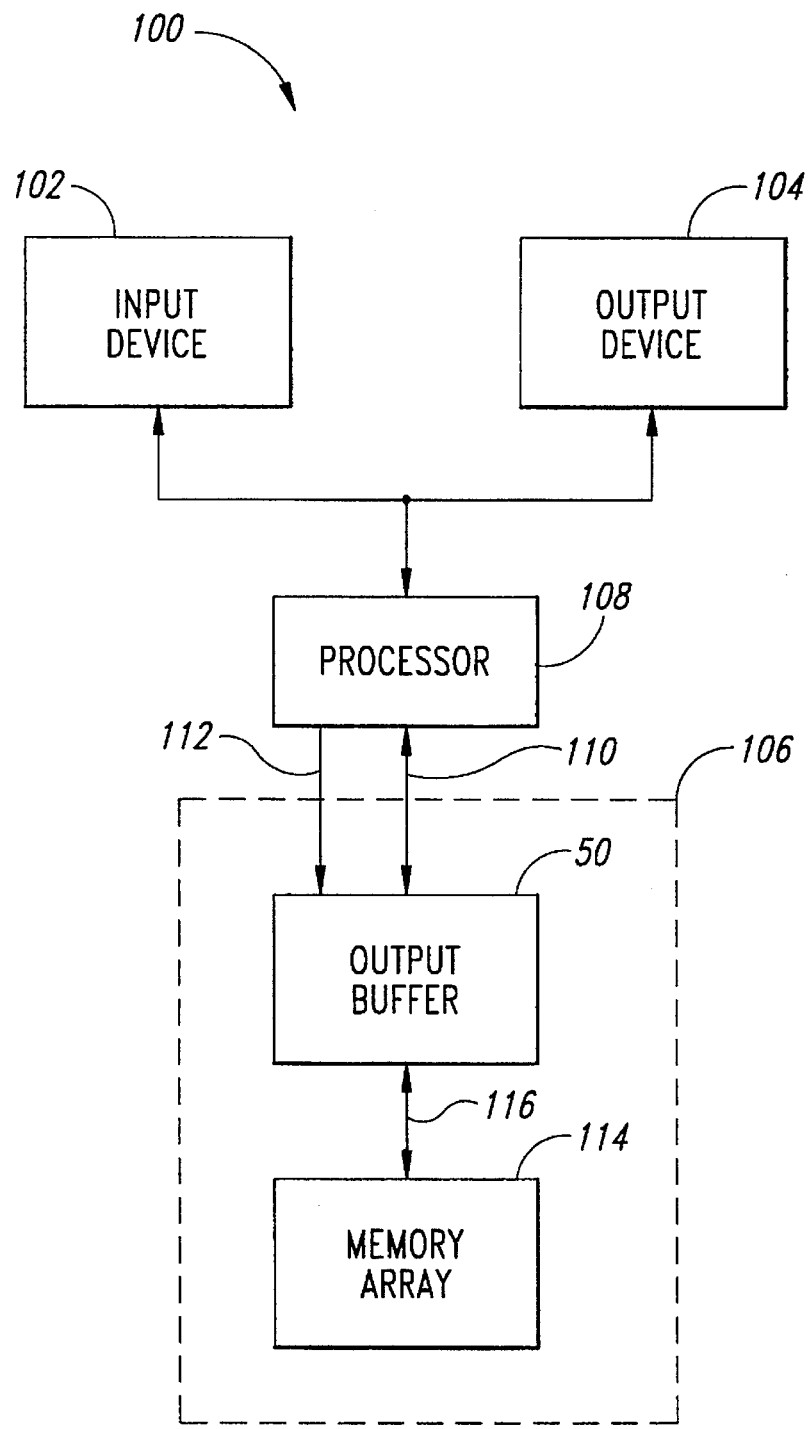
FIG. 3 is a block diagram of a computer system including the preferred output buffer of FIG. 2.

As shown in FIG. 3, a computer system 100 including the output buffer 50 has an input device 102, such as a keyboard, an output device 104, such as a computer display, a memory device 106, such as a DRAM, and a processor 108 coupled to the input device 102, the output device 104 and the memory device 106. The memory device 106 includes the output buffer 50 coupled to the processor 108 through an external data bus 110 and a control bus 112, and a memory array 114 coupled to the output buffer 50 through an internal I/O bus 116.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

I claim:

1. An output buffer in a memory device for outputting a buffered signal corresponding to an input signal, the output buffer comprising:

a boot capacitor having first and second terminals;

a charging circuit coupling the boot capacitor's first terminal to a supply voltage when the input signal is inactive and isolating the first terminal from the supply voltage when the input signal is active;

a boot circuit coupling the boot capacitor's second terminal to a reference potential when the input signal is inactive and to a bias voltage when the input signal is active, the bias voltage being greater than the reference potential by at least a first threshold voltage, the boot and charging circuits thereby storing the supply voltage less the reference potential on the boot capacitor when the input signal is inactive and boosting a boot voltage at the boot capacitor's first terminal above the supply voltage by at least the first threshold voltage when the input signal is active;

a pass transistor having an input terminal coupled to the boot capacitor's first terminal to receive the boot voltage, a control terminal receiving a pass control voltage, and an output terminal, the pass transistor outputting the boot voltage at its output terminal when the boot voltage is greater than the pass control voltage by at least a second threshold voltage, the pass transistor otherwise isolating its output terminal from the boot voltage;

a pull-up transistor having a supply terminal receiving the supply voltage, a control terminal coupled to the pass transistor's output terminal, and an output terminal outputting the buffered signal at the supply voltage when the voltage applied to the control terminal is greater than the supply voltage by at least the first threshold voltage;

a pull-down transistor having a reference terminal coupled to the reference potential, a control terminal receiving a pull-down control voltage, and an output terminal coupled to the pull-up transistor's control terminal, the pull-down transistor coupling the pull-up transistor's control terminal to the reference potential when the pull-down control voltage is greater than the reference potential by at least a third threshold voltage, the pull-down transistor otherwise isolating the pull-up transistor's control terminal from the reference potential; and a control circuit having a feedback terminal coupled to one of the boot capacitor's first and second terminals to receive a feedback voltage, a first output terminal coupled to the pass transistor's control terminal to provide the pass control voltage, and a second output terminal coupled to the pull-down transistor's control terminal to provide the pull-down control voltage, the control circuit outputting the pass control voltage less than the boot voltage by at least the second threshold voltage and the pull-down control voltage greater than the reference potential by less than the third threshold voltage when the input signal is active, thereby causing the pull-down transistor to isolate the pull-up transistor's control terminal from the reference potential and causing the pass transistor to supply the boot voltage to the pull-up transistor's control terminal so the pull-up transistor outputs the buffered signal at the supply voltage, the control circuit outputting the pass control voltage greater than the reference potential by the supply voltage when the input signal is inactive and outputting the pull-down control voltage greater than the reference potential by at least the third threshold voltage only when the input signal is inactive and the feedback voltage corresponds to the boot voltage being greater than the pass control voltage by less than the second threshold voltage, thereby preventing the boot capacitor from discharging its stored voltage through the pass and pull-down transistors to the reference potential when the input signal is inactive.

2. The output buffer of claim 1 wherein the charging circuit comprises:

an inverter having an output terminal, the inverter outputting a high voltage at its output terminal greater than the supply voltage when the input signal is inactive and isolating its output terminal from the high voltage when the input signal is active; and an NMOS transistor having a drain coupled to the supply voltage, a gate coupled to the inverter's output terminal to receive the high voltage, and a source coupled to the boot capacitor's first terminal, the NMOS transistor outputting the supply voltage at its source when it receives the high voltage and otherwise isolating its source from the supply voltage.

3. The output buffer of claim 1 wherein the boot circuit comprises an inverter having an output terminal coupled to the boot capacitor's second terminal, the inverter outputting the reference potential at its output terminal when the input signal is inactive and outputting the supply voltage at its output terminal when the input signal is active.

4. The output buffer of claim 1 wherein the pass transistor comprises a PMOS transistor having a source coupled to the boot capacitor's first terminal to receive the boot voltage, a gate coupled to the control circuit's first output terminal to receive the pass control voltage, and a drain coupled to the pull-up transistor's control terminal to output the boot voltage.

5. The output buffer of claim 1 wherein the pull-up transistor comprises an NMOS transistor having a drain coupled to the supply voltage, a gate coupled to the pass transistor's output terminal, and a source outputting the buffered signal.

6. The output buffer of claim 1 wherein the control circuit includes a NOR logic element having a first input terminal coupled to the boot capacitor's first terminal to receive the boot voltage, a second input terminal receiving the input signal, and an output terminal coupled to the pull-down transistor's control terminal to provide the pull-down control voltage.

7. A memory device comprising:

a memory array; and an output buffer coupled to the memory array, the output buffer for outputting a buffered signal corresponding to an input signal, the output buffer comprising:

a boot capacitor having first and second terminals;

a charging circuit coupling the boot capacitor's first terminal to a supply voltage when the input signal is inactive and isolating the first terminal from the supply voltage when the input signal is active;

a boot circuit coupling the boot capacitor's second terminal to a reference potential when the input signal is inactive and to a bias voltage when the input signal is active, the bias voltage being greater than the reference potential by at least a first threshold voltage, the boot and charging circuits thereby storing the supply voltage less the reference potential on the boot capacitor when the input signal is inactive and boosting a boot voltage at the boot capacitor's first terminal above the supply voltage by at least the first threshold voltage when the input signal is active;

a pass transistor having an input terminal coupled to the boot capacitor's first terminal to receive the boot voltage, a control terminal receiving a pass control voltage, and an output terminal, the pass transistor outputting the boot voltage at its output terminal when the boot voltage is greater than the pass control voltage by at least a second threshold voltage, the pass transistor otherwise isolating its output terminal from the boot voltage;

a pull-up transistor having a supply terminal receiving the supply voltage, a control terminal coupled to the pass transistor's output terminal, and an output terminal outputting the buffered signal at the supply voltage when the voltage applied to the control terminal is greater than the supply voltage by at least the first threshold voltage;

a pull-down transistor having a reference terminal coupled to the reference potential, a control terminal receiving a pull-down control voltage, and an output terminal coupled to the pull-up transistor's control terminal, the pull-down transistor coupling the pull-up transistor's control terminal to the reference potential when the pull-down control voltage is greater than the reference potential by at least a third threshold voltage, the pull-down transistor otherwise isolating the pull-up transistor's control terminal from the reference potential; and a control circuit having a feedback terminal coupled to one of the boot capacitor's first and second terminals to receive a feedback voltage, a first output terminal coupled to the pass transistor's control terminal to provide the pass control voltage, and a second output terminal coupled to the pull-down transistor's control terminal to provide the pull-down control voltage, the control circuit outputting the pass control voltage less than the boot voltage by at least the second threshold voltage and the pull-down control voltage greater than the reference potential by less than the third threshold voltage when the input signal is active, thereby causing the pull-down transistor to isolate the pull-up transistor's control terminal from the reference potential and causing the pass transistor to supply the boot voltage to the pull-up transistor's control terminal so the pull-up transistor outputs the buffered signal at the supply voltage, the control circuit outputting the pass control voltage greater than the reference potential by the supply voltage when the input signal is inactive and outputting the pull-down control voltage greater than the reference potential by at least the third threshold voltage only when the input signal is inactive and the feedback voltage corresponds to the boot voltage being greater than the pass control voltage by less than the second threshold voltage, thereby preventing the boot capacitor from discharging its stored voltage through the pass and pull-down transistors to the reference potential when the input signal is inactive.

8. The memory device of claim 7 wherein the charging circuit comprises:

an inverter having an output terminal, the inverter outputting a high voltage at its output terminal greater than the supply voltage when the input signal is inactive and isolating its output terminal from the high voltage when the input signal is active; and an NMOS transistor having a drain coupled to the supply voltage, a gate coupled to the inverter's output terminal to receive the high voltage, and a source coupled to the boot capacitor's first terminal, the NMOS transistor outputting the supply voltage at its source when it receives the high voltage and otherwise isolating its source from the supply voltage.

9. The memory device of claim 7 wherein the boot circuit comprises an inverter having an output terminal coupled to the boot capacitor's second terminal, the inverter outputting the reference potential at its output terminal when the input signal is inactive and outputting the supply voltage at its output terminal when the input signal is active.

10. The memory device of claim 7 wherein the pass transistor comprises a PMOS transistor having a source coupled to the boot capacitor's first terminal to receive the boot voltage, a gate coupled to the control circuit's first output terminal to receive the pass control voltage, and a drain coupled to the pull-up transistor's control terminal to output the boot voltage.

11. The memory device of claim 7 wherein the pull-up transistor comprises an NMOS transistor having a drain coupled to the supply voltage, a gate coupled to the pass transistor's output terminal, and a source outputting the buffered signal.

12. The memory device of claim 7 wherein the control circuit includes a NOR logic element having a first input terminal coupled to the boot capacitor's first terminal to receive the boot voltage, a second input terminal receiving the input signal, and an output terminal coupled to the pull-down transistor's control terminal to provide the pull-down control voltage.

13. A computer system comprising:

an input device;

an output device;

a processor coupled to the input and output devices; and a memory device coupled to the processor, the memory device comprising:

a memory array; and an output buffer coupled to the memory array, the output buffer for outputting a buffered signal corresponding to an input signal, the output buffer comprising:

a boot capacitor having first and second terminals;

a charging circuit coupling the boot capacitor's first terminal to a supply voltage when the input signal is inactive and isolating the first terminal from the supply voltage when the input signal is active;

a boot circuit coupling the boot capacitor's second terminal to a reference potential when the input signal is inactive and to a bias voltage when the input signal is active, the bias voltage being greater than the reference potential by at least a first threshold voltage, the boot and charging circuits thereby storing the supply voltage less the reference potential on the boot capacitor when the input signal is inactive and boosting a boot voltage at the boot capacitor's first terminal above the supply voltage by at least the first threshold voltage when the input signal is active;

a pass transistor having an input terminal coupled to the boot capacitor's first terminal to receive the boot voltage, a control terminal receiving a pass control voltage, and an output terminal, the pass transistor outputting the boot voltage at its output terminal when the boot voltage is greater than the pass control voltage by at least a second threshold voltage, the pass transistor otherwise isolating its output terminal from the boot voltage;

a pull-up transistor having a supply terminal receiving the supply voltage, a control terminal coupled to the pass transistor's output terminal, and an output terminal outputting the buffered signal at the supply voltage when the voltage applied to the control terminal is greater than the supply voltage by at least the first threshold voltage;

a pull-down transistor having a reference terminal coupled to the reference potential, a control terminal receiving a pull-down control voltage, and an output terminal coupled to the pull-up transistor's control terminal, the pull-down transistor coupling the pull-up transistor's control terminal to the reference potential when the pull-down control voltage is greater than the reference potential by at least a third threshold voltage, the pull-down transistor otherwise isolating the pull-up transistor's control terminal from the reference potential; and a control circuit having a feedback terminal coupled to one of the boot capacitor's first and second terminals to receive a feedback voltage, a first output terminal coupled to the pass transistor's control terminal to provide the pass control voltage, and a second output terminal coupled to the pull-down transistor's control terminal to provide the pull-down control voltage, the control circuit outputting the pass control voltage less than the boot voltage by at least the second threshold voltage and the pull-down control voltage greater than the reference potential by less than the third threshold voltage when the input signal is active, thereby causing the pull-down transistor to isolate the pull-up transistor's control terminal from the reference potential and causing the pass transistor to supply the boot voltage to the pull-up transistor's control terminal so the pull-up transistor outputs the buffered signal at the supply voltage, the control circuit outputting the pass control voltage greater than the reference potential by the supply voltage when the input signal is inactive and outputting the pull-down control voltage greater than the reference potential by at least the third threshold voltage only when the input signal is inactive and the feedback voltage corresponds to the boot voltage being greater than the pass control voltage by less than the second threshold voltage, thereby preventing the boot capacitor from discharging its stored voltage through the pass and pull-down transistors to the reference potential when the input signal is inactive.

14. The computer system of claim 13 wherein the charging circuit comprises:

an inverter having an output terminal, the inverter outputting a high voltage at its output terminal greater than the supply voltage when the input signal is inactive and isolating its output terminal from the high voltage when the input signal is active; and an NMOS transistor having a drain coupled to the supply voltage, a gate coupled to the inverter's output terminal to receive the high voltage, and a source coupled to the boot capacitor's first terminal, the NMOS transistor outputting the supply voltage at its source when it receives the high voltage and otherwise isolating its source from the supply voltage.

15. The computer system of claim 13 wherein the boot circuit comprises an inverter having an output terminal coupled to the boot capacitor's second terminal, the inverter outputting the reference potential at its output terminal when the input signal is inactive and outputting the supply voltage at its output terminal when the input signal is active.

16. The computer system of claim 13 wherein the pass transistor comprises a PMOS transistor having a source coupled to the boot capacitor's first terminal to receive the boot voltage, a gate coupled to the control circuit's first output terminal to receive the pass control voltage, and a drain coupled to the pull-up transistor's control terminal to output the boot voltage.

17. The computer system of claim 13 wherein the pull-up transistor comprises an NMOS transistor having a drain coupled to the supply voltage, a gate coupled to the pass transistor's output terminal, and a source outputting the buffered signal.

18. The computer system of claim 13 wherein the control circuit includes a NOR logic element having a first input terminal coupled to the boot capacitor's first terminal to receive the boot voltage, a second input terminal receiving the input signal, and an output terminal coupled to the pull-down transistor's control terminal to provide the pull-down control voltage.

* * * * *